(12) United States Patent
Arslan et al.

(10) Patent No.: US 10,235,239 B2
(45) Date of Patent: *Mar. 19, 2019

(54) POWER SAVINGS IN COLD STORAGE

(71) Applicant: Quantum Corporation, San Jose, CA (US)

(72) Inventors: Suayb S. Arslan, Irvine, CA (US); Turguy Goker, Vista, CA (US)

(73) Assignee: Quantum Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/942,686

(22) Filed: Apr. 2, 2018

(65) Prior Publication Data

US 2018/0225172 A1    Aug. 9, 2018

Related U.S. Application Data

(63) Continuation of application No. 15/002,560, filed on Jan. 21, 2016, now Pat. No. 9,965,351.

(Continued)

(51) Int. Cl.
*G06F 3/06* (2006.01)
*G06F 11/10* (2006.01)
(Continued)

(52) U.S. Cl.
CPC .......... *G06F 11/1008* (2013.01); *G06F 1/266* (2013.01); *G06F 1/3268* (2013.01);
(Continued)

(58) Field of Classification Search
CPC .. G06F 11/1008; G06F 3/0619; G06F 3/0625; G06F 3/0653; G06F 3/0679;
(Continued)

(56) References Cited

U.S. PATENT DOCUMENTS 6,785,632 B1 * 8/2004 Goker ................. G05B 23/024
700/51
8,930,647 B1    1/2015 Smith
(Continued)

OTHER PUBLICATIONS

Non-Final Office Action dated Jul. 27, 2017 for U.S. Appl. No. 15/002,560.
(Continued)

*Primary Examiner* — Pierre Miche Bataille
(74) *Attorney, Agent, or Firm* — Eschweiler & Potashnik, LLC

(57) ABSTRACT

Methods and apparatus associated with data cold storage are described. Example apparatus include an array of data storage devices arranged in rows and columns. Columns of the array are orthogonal to rows. A row has an associated row-centric power supply, and a column has an associated column-centric local electronics module (LEM) that controls a data storage device in the column independently of other data storage devices in the array. Example apparatus include logics that control a power mode of a data storage device independently of other data storage devices in the array, that control a power mode of an LEM, that adaptively regulate the level of data stored in a buffer, and that determine whether a data object will be stored in the buffer or stored on a data storage device in the array, based on the probability the data object will be accessed within a threshold period of time.

20 Claims, 9 Drawing Sheets

Related U.S. Application Data

(60) Provisional application No. 62/108,190, filed on Jan. 27, 2015.

(51) Int. Cl.

| | | |
|---|---|---|
| *H03M 13/35* | (2006.01) | |
| *G06F 1/26* | (2006.01) | |
| *G06F 1/3234* | (2019.01) | |
| *G11B 20/12* | (2006.01) | |
| *G11B 20/18* | (2006.01) | |
| *H03M 13/37* | (2006.01) | |
| *H03M 13/00* | (2006.01) | |
| *H03M 13/13* | (2006.01) | |

(52) U.S. Cl.
CPC .......... *G06F 3/0619* (2013.01); *G06F 3/0625* (2013.01); *G06F 3/0653* (2013.01); *G06F 3/0679* (2013.01); *G06F 11/1048* (2013.01); *G11B 20/1217* (2013.01); *G11B 20/1833* (2013.01); *H03M 13/353* (2013.01); *H03M 13/373* (2013.01); *H03M 13/611* (2013.01); *H03M 13/13* (2013.01); *H03M 13/6381* (2013.01); *H03M 13/6393* (2013.01); *H03M 13/6513* (2013.01)

(58) Field of Classification Search
CPC .......... G06F 1/266; G06F 1/3268; G06F 1/26; G06F 1/32; H03M 13/353; H03M 13/373; H03M 13/611; H03M 13/13; H03M 13/6381; H03M 13/6393; H03M 13/6513; G11B 20/1217; G11B 20/1833; G11B 20/12
USPC ........................................................ 711/114
See application file for complete search history.

(56) References Cited

U.S. PATENT DOCUMENTS

| | | | |
|---|---|---|---|
| 9,182,914 | B1 | 11/2015 | Smith |
| 9,367,353 | B1 * | 6/2016 | Ellis ...................... G06F 9/4893 |
| 9,432,298 | B1 * | 8/2016 | Smith ................. H04L 49/9057 |
| 10,007,573 | B2 * | 6/2018 | Plants ................. G06F 11/1068 |
| 2008/0201593 | A1 | 4/2008 | Hori et al. |
| 2014/0143479 | A1 * | 5/2014 | Manning ............. G06F 11/2069 711/103 |
| 2014/0188817 | A1 | 7/2014 | Plocher et al. |
| 2014/0380114 | A1 | 12/2014 | Alexeev et al. |
| 2016/0062651 | A1 | 3/2016 | Hineman et al. |
| 2016/0217031 | A1 * | 7/2016 | Arslan ................ G06F 11/1008 |
| 2016/0335177 | A1 | 11/2016 | Huang et al. |

OTHER PUBLICATIONS

Notice of Allowance dated Jan. 3, 2018 for U.S. Appl. No. 15/002,560.

\* cited by examiner

POWER SAVINGS IN COLD STORAGE

REFERENCE TO RELATED APPLICATIONS

This Application is a Continuation of U.S. application Ser. No. 15/002,560 filed on Jan. 21, 2016, which claims priority to U.S. Provisional Application No. 62/108,190 filed on Jan. 27, 2015. The contents of the above-referenced matters are hereby incorporated by reference in their entirety.

BACKGROUND

The amount of electronic data stored increases daily. The amount of data accessed by storage devices continues to grow. The number and type of storage devices used to store and access data used also continues to expand. Even as miniaturization and advancing technology increase the sophistication, reliability, and capacity of storage devices including hard disk drives, (HDD), solid state drives (SDD), shingled magnetic recording (SMR) devices, and tape drives, improved efficiencies are constantly sought for these devices. Improved efficiencies are needed because users who store data have finite resources. Finite resources may include electricity, cooling capacity, or physical storage space in which to locate storage devices. In particular, electricity is limited and may be costly. Additionally, as more and more storage devices store and access more and more data, the power and resources required to operate those devices, and to maintain the facilities in which those devices are stored, continues to increase.

One approach to improving the efficiency of electrical and other resource consumption in data storage is cold data storage. Conventional cold storage approaches may employ rack mountable apparatus that include entire rows of drives, row-level power supplies, and row-level electronics control modules. However, data is frequently accessed a column at a time, and not a row at a time. Conventional systems may cause a disk drive or other storage device in a row to be activated and power up when a column of data is accessed, which may in turn cause the row-level electronics module or other drives in the row to also power up. Thus, if a column of drives contains a number of drives, that number of row-level electronics modules will need to be powered up to access the column. Conventional systems thus may waste energy.

One conventional cold storage approach is the Open Compute Cold Storage system. Current Open Compute Cold Storage systems are built on storage nodes. A storage node may include thirty drives arranged in a row and a local electronics module associated with the row. A full rack may contain sixteen storage nodes. Conventional approaches are capable of allowing a maximum of two drives per storage node to operate at full power mode, which may be required for read or write operations. The remaining drives in a storage node may be spun down to operate in a power savings mode. However, conventional approaches still require all sixteen local electronics modules (one local electronics module for each row) to be powered up to full power mode even though each local electronics module only serves a maximum of two drives at any moment. The requirement to power up all sixteen local electronics modules puts a lower limit on the minimum power needed to read or write data from the full rack.

BRIEF DESCRIPTION OF THE DRAWINGS

The accompanying drawings, which are incorporated in and constitute a part of the specification, illustrate various example apparatus, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
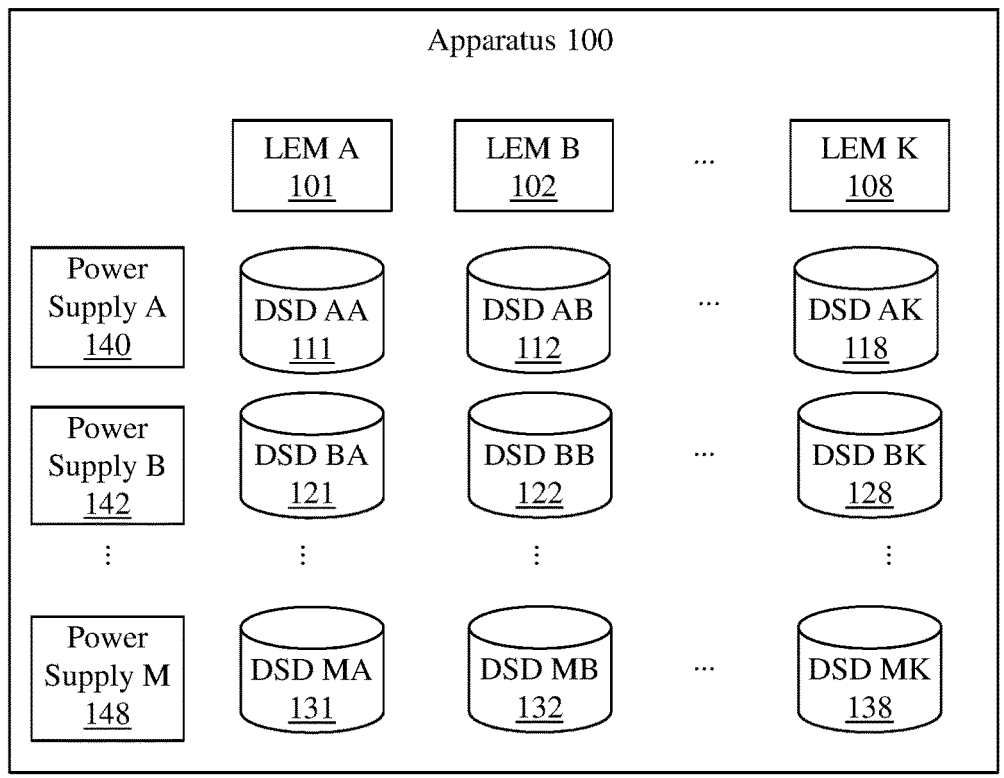
FIG. 1 illustrates an example data storage apparatus.

Example methods and apparatus provide power savings for the computer specific problems of cold data storage on a modular data storage node. This problem did not exist before the advent of electronic data cold storage systems. Increasing the energy efficiency of an array of rack mounted data storage nodes cannot be performed in the human mind because the human mind cannot control the transmission or expenditure of electricity in an electronic device. Similarly, reducing the amount of electricity used by an array of rack mounted data storage devices cannot be performed using paper and pencil because neither paper nor pencil can control the transmission or usage of electricity in an electronic device. For example, neither the human mind nor pencil and paper can control the power used by a hard disk drive as it switches between operating modes.

Example apparatus and methods improve on conventional cold storage systems by allowing storage devices and local electronics control modules (LEMs) to be placed in a power saving mode independently of other storage devices and LEMs in the apparatus. Example apparatus and methods employ buffer-based adaptive power saving and erasure coding. Example cold storage apparatus and methods may be based on a low cost, high capacity SMR device array with orthogonally configured row-centric power supplies and column-centric LEMs. Example apparatus and methods jointly minimize power supply and LEM operating power by selecting active storage devices and LEM power modes using a multi variable power management approach based on buffer regulation and data hotness estimation. Example methods and apparatus may encode data to be stored in an array of data storage devices using an erasure code (EC) approach and spread the encoded data to an optimum set of active storage devices where storage device and LEM power modes are controlled by an SSD buffer, minimizing the total power used by the array and the number of spin up and load/unload cycles incurred by storage devices in the array. Example methods and apparatus keep data that is more likely to be accessed within a threshold period of time in an SSD buffer that is used as a cache, while data that is less likely to be accessed within the threshold period of time is transferred to active storage devices for long term storage via active LEMs, while remaining storage devices and LEMs are placed in a power saving mode.

Conventional cold storage systems may require a full rack power of 1900 W. For example, an Open Compute Cold Storage system using an Open Vault storage unit with only two 4TB SMR HDDs spinning consumes 80 W, while the associated compute node consumes 300 W. Thus, the rack power budget for a full rack is 80 W×16+300 W×2=1880 W. In this example, 4TB Seagate 6 GB/s serial ATA (SATA) SMR drives that use 7.5 W to operate in a read/write mode are used. In this example, a Knox storage unit that consumes 80 W with a maximum of 2 HDDs operating in read/write mode are employed. Thus, a 1.92PB cold storage system including 480 4TB HDDs arranged in 30 HDD 2U storage nodes with 16 nodes per rack consumes 1900 W when operating at full capacity. A 16 node conventional system consuming 80 W for each node with only 2 HDDs per node active still has a base power consumption of 16×65 W=1040 W. Conventional approaches may attempt to spin down some of the drives in the system to conserve power. However, since conventional LEMs are associated with rows, and thus draw their power from row-centric power supplies, conventional systems must keep the LEMs powered up even though each LEM is only controlling as few as one storage device.

Example methods and apparatus improve on conventional approaches by using column-centric LEMs arranged orthogonally to rows of HDDs powered by row-centric power supplies to control individual HDDs in a column. In one embodiment, a 1.92PB storage array including orthogonally positioned LEMs controlling HDDs in a column achieves a base power of 130 W, which is one eighth of the base power needed by a similar conventional system. The conventional system described above must power up the local electronics for the row of each accessed HDD in the column. In contrast, example methods and apparatus only need to power up the column-centric LEM associated with the column being accessed. Thus, a conventional system with sixteen rows would need to power up sixteen LEMs to control a column of storage devices, while example methods and apparatus would only need to power up one LEM to control the same column of storage devices.

Compare a conventional 1.92PB cold storage system with 480 4 TB HDDs arranged in 30 HDD 2U storage nodes with 16 nodes per rack, with a similar 1.92PB cold storage system with 480 4 TB HDDs as described by example methods and apparatus. Both the conventional system and the system described by example methods and apparatus have the same number of HDDs physically arranged in a similar configuration in similar storage hardware, and offer the same volume of storage. However, example methods and apparatus have a different local electronics requirement. Conventional systems require local electronics for each row. For example, the Open Compute Cold Storage system requires local electronics that draw 65 W of power to control switching or local simple processing for a maximum of two active HDDs in a row. The conventional Open Compute Cold Storage system also requires sixteen 30 port local electronics systems. In contrast, example methods and apparatus may employ simple SATA to Ethernet multi-port switch LEMs that control just the active sets of HDDs, which in this example is sixteen active HDDs in a column. Example methods and apparatus may also employ 30 LEMs (one LEM for each column in the array) with each LEM having at least 16 ports (one port for each row in the array). In one embodiment, only 130 W may be needed to power the LEMs. Thus, while a conventional 1.92PB cold storage system requires 1900 W, one embodiment of example methods and apparatus may only use 973 W for a 1.92PB system, which is a concrete, measurable improvement of approximately 50% over the conventional approach.

Example methods and apparatus achieve this approximately 50% improvement in power consumption by controlling at read/write power levels only those local electronics and HDDs needed to access data stored in a column of the array. For example, one embodiment of example methods and apparatus requires 30 LEMs, but only one LEM needs to be powered up to access data in an associated column, and each LEM only requires 16 ports. Conventional approaches require fewer LEMs (e.g. 16 LEMs: one for reach row) but require 30 ports for each LEM, and all sixteen LEMs in the conventional system need to be powered up to access data in a column.

The example conventional system of 16 storage nodes requires 16 storage node power supplies (or 16 row power supplies), each with a maximum load of 85 W. Example methods and apparatus may only use 16 HDD power supplies with a maximum load of 20 W each, because example methods and apparatus use the column-centric LEMs to control only those HDDs in the column needed to access data in the column, whereas the conventional system has to control HDDs in a column using a conventional row-centric power supply.

Example methods and apparatus may also employ erasure codes to improve reliability and power usage efficiency compared to conventional approaches. Erasure coding uses additional redundant data to produce erasure codes (EC) that protect against data 'erasures'. An erasure may be an error with a location that is known a priori. Erasure codes allow data portions that are lost to be reconstructed from the surviving data. The application of erasure codes to data storage may typically have been for the purpose of recovering data in the face of failures of hardware elements storing the data.

An erasure code is a forward error correction scheme for storage applications. An erasure code transforms a message of k symbols into a longer message. The longer message may be referred to as a code-word with n=k+p symbols such that the original message can be recovered from any available k symbols. Example methods and apparatus may implement both Reed-Solomon (RS) erasure codes and Rateless erasure codes, while conventional approaches only use RS codes.

Example methods and apparatus also facilitate the local rebuilding or repair of failed or damaged HDDs.

Therefore, example apparatus and methods improve on conventional data cold storage approaches by reducing the power consumed by a data storage device array by approximately 50% while offering improved erasure coding and repair capabilities.

Example methods and apparatus may further reduce power usage in data cold storage systems by optimizing the power modes of active HHD sets. Continuing with the example system described above, an active HDD set may be defined as 2 HDDs per storage node in a system that includes 16 storage nodes. Example methods and apparatus avoid transferring data simultaneously to all 16 active drives in a column. Thus, example methods and apparatus may schedule the power modes of HDDs in the column. For example, active drives may have their spindles running and heads loaded. Drives actively reading or writing will be in an operational mode drawing maximum power. However, all the other drives that are not reading or writing may be placed in an active idle mode and thus may only draw 45% of maximum power or less. Example methods and apparatus may spread data to be stored down a column sequentially, which means not all the drives in a column need to be powered up to maximum power simultaneously. A drive in a column may be queued and then switched to a read/write mode from active idle mode a threshold time before the drive is needed for a read/write operation. By sequentially controlling the power mode of drives in a column, example methods and apparatus further reduce power consumption in the example 1.92PB system from 975 W to 850 W. At this level of energy efficiency, example methods and apparatus may not need cooling fans, thus further increasing the mechanical reliability of example apparatus, and further decreasing the power needed to operate the system. Example methods and apparatus may also schedule reads and writes from column to column to sequentially control power modes across columns, in addition to sequentially controlling power modes within a column.

The detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, calculating, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

FIG. 1 illustrates a data storage apparatus 100. Apparatus 100 may include N data storage devices (DSD) 111-138 arranged in K columns and M rows. The K columns are orthogonal to the M rows. K, M, and N are integers. For example, DSD AA 111, DSD AB 112, and DSD AK 118 are arranged in a first row of DSDs. DSD AB 112, DSD BB 122, and DSD MB 132 are arranged in a column of DSDs orthogonal to the first row of DSDs. The N data storage devices may be mounted in a rack-mount device. The N data storage devices may be SMR SATA devices. In another embodiment, other types of data storage devices may be used.

A row of data storage devices has an associated row-centric power supply that supplies power to the row of data storage devices. For example, the row of DSDs including DSD AA 111, DSD AB 112, and DSD AK 118 is associated with Power Supply A 140. The row of DSDs including DSD BA 121, DSD BB 122, and DSD BK 128 is associated with Power Supply B 142. The row of DSDs including DSD MA 131, DSD MB 132, and DSD MK 138 is associated with Power Supply M 148.

In one embodiment, a column of DSDs has an associated column-centric LEM that controls a DSD in the column of data storage devices independently of other data storage devices in the same row as the controlled data storage device. For example, DSD AB 112, DSD BB 122, and DSD MB 132 are arranged in a column associated with LEM B 102. In the embodiment illustrated in FIG. 1, LEM B 102 may control DSD AB 112 independently of DSD AA 111 or DSD AK 118.

In this embodiment, an LEM has at least M ports. In this example, M is the number of rows of DSDs in the apparatus 100. An LEM controls a DSD in a column associated with the LEM through one of the M ports. Thus, an LEM may control any or all of the DSDs in the associated column. For example, LEM A 101 may control any of the DSDs in the column of DSDs that includes DSD AA 111, DSD BA 121, and DSD MA 131. LEM K 108 may control members of the DSDs in the column of DSDs that includes DSD AK 118, DSD BK 128 and DSD MK 138. Data storage apparatus 100 includes at least K LEMs and M row-centric power supplies.

In one embodiment of apparatus 100, an LEM may be a serial ATA (SATA) to Ethernet conversion switch fabric, a processor based interface system, or an Ethernet switch fabric. An LEM may also have a programmable power saving mode.

In one embodiment of apparatus 100, the number of columns K is 30, and the number of rows M is 16. In other embodiments, other numbers of rows or other numbers of columns may be employed.

Figure 2:
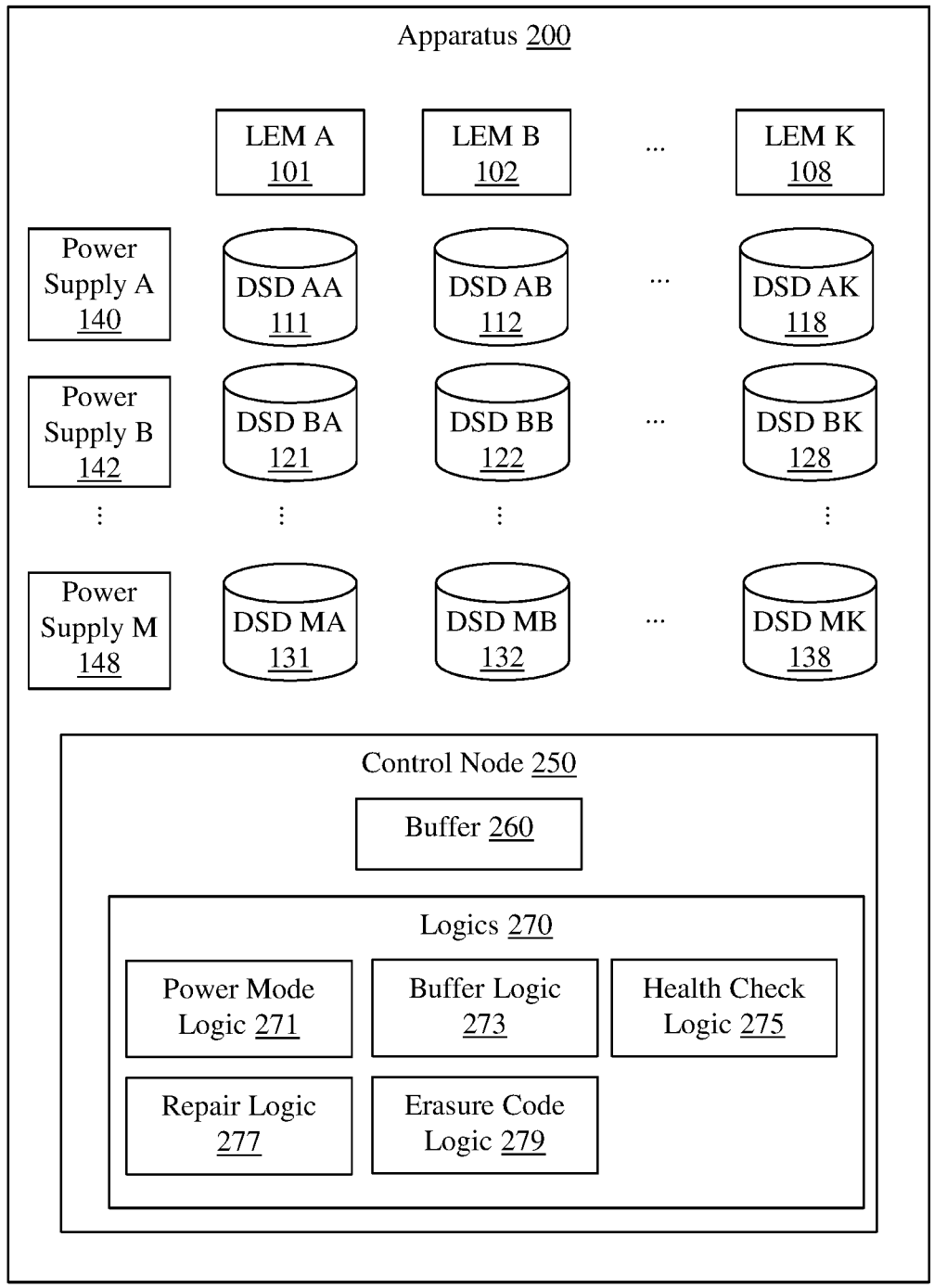
FIG. 2 illustrates an example data storage apparatus.

FIG. 2 illustrates an example data storage apparatus 200. Apparatus 200 is similar to apparatus 100 but includes additional elements. Apparatus 200 includes control node 250. Control node 250 includes a buffer 260 and a set of logics 270. The set of logics 270 includes power mode logic 271. Power mode logic 271 controls a power mode of a member of the N data storage devices independently of other data storage devices in the same row as the member of the N data storage devices. For example, power mode logic 271 may control DSD BB 122 independently of DSD BA 121 and DSD BK 128. Power mode logic 271 also controls a power mode of a member of the K LEMs. In this example, LEM B 102 may be controlled by power mode logic 271 to control DSD BB 122. Power mode logic 271 may control an LEM to be in one of plurality of possible power modes. Power mode logic 271 thus provides an improvement over conventional approaches by controlling an LEM that is associated with a column of DSDs engaged in read or write operations to be in an active power mode, while controlling an LEM that is associated with a column of DSDs that are not engaged in read or write operations to be in a lower power mode.

The set of logics 270 also includes a buffer logic 273. Buffer logic 273 adaptively regulates the level of data stored in the buffer 260. Buffer logic 273 determines whether a data object will be stored in the buffer 260 or whether the data object will be stored on a member of the N data storage devices 111-138, based, at least in part, on the level of data stored in the buffer 260 or on a classification of the data object. Buffer logic 273 facilitates minimizing cache misses based on temporal and spatial correlations of data or instructions.

In one embodiment of apparatus 200, a row-centric power supply supplies power to a number of data storage devices X operating at full power in a row of DSDs in the apparatus 200. Alternately, a row-centric power supply may supply power to a number of data storage devices Y operating at full power in the row and a number of data storage devices Z operating at less than full power in the row. For example, Power Supply A 140 may be a row-centric power supply. Power Supply A 140 may supply power to DSD AA 111 and DSD AB 112 that are both operating a full power. In another example, Power Supply A 140 may supply power to DSD AA 111 that is operating at full power, while also providing power to DSD AK 118, which is operating at less than full power. In this example, X, Y, and Z are integers, Y<X, Z<X, and X=Y+Z. In one embodiment, X=2. In one embodiment, X is user adjustable. Adjusting X to values greater than 2 may affect the performance of the apparatus 200 at the cost of increased power consumption.

In one embodiment of apparatus 200, power mode logic 271 adaptively controls a member of the N data storage devices to be in one of a plurality of power modes. The plurality of power modes may include, in no particular order, a spindle off mode, an electronics off mode, a read/write mode, an active idle mode, a low power idle mode, a sleep mode, a power off mode, or a heads unloaded mode. Power mode logic 271 also adaptively controls a member of the K LEMs to be in one of a plurality of power modes including full power mode, a sleep mode, a low power mode, or a power off mode. For example, power mode logic 271 may control DSD AB 112 to be in spindle off mode. Power mode logic 271 may control DSD BB 122 to be in a sleep mode, and LEM B to be in a full power mode. In other embodiments, other power modes may be employed.

Figure 9:
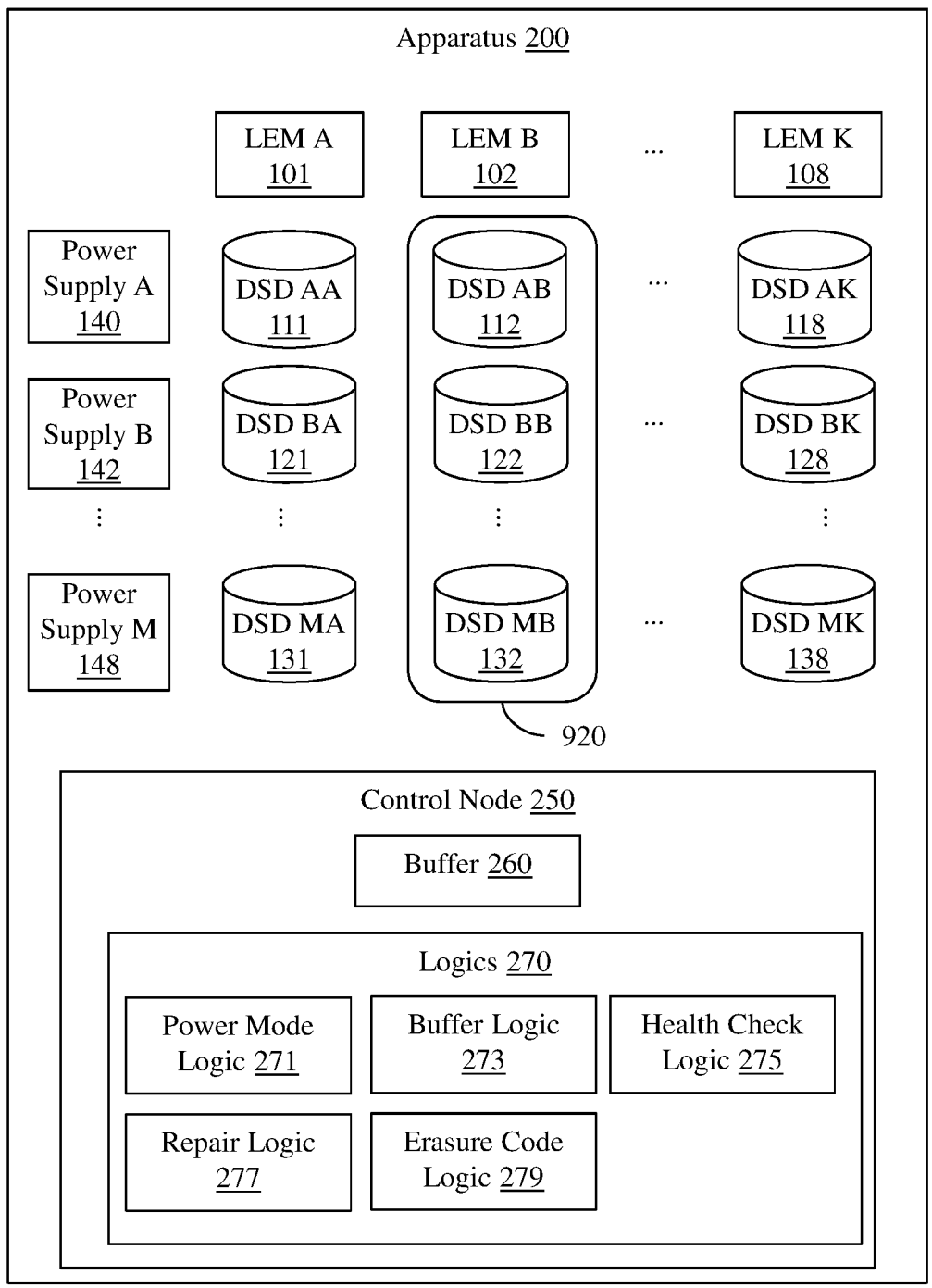
FIG. 9 illustrates an example implementation of example methods and apparatus.

In one embodiment, a column of data storage devices in the apparatus 200 may be defined as an encoded HDD set. FIG. 9 illustrates an example implementation of apparatus and methods described herein. FIG. 9 illustrates one possible implementation of apparatus 200. An encoded HDD set 920 is highlighted. Encoded HDD set 920 includes DSD AB 112, DSD BB 122, and DSD MB 132. Encoded HDD set 920 is associated with column-centric LEM B 102. In other embodiments, other encoded HDD sets may be defined, including other LEMs associated with other columns of DSDs.

In one embodiment of apparatus 200, the set of logics 270 includes health check logic 275 and repair logic 277. Health check logic 275 produces a reliability score for a member of the N data storage devices. For example, health check logic 275 may monitor the rate of failure for a DSD in the N data storage devices, the age of a DSD in the N data storage devices, or may monitor other properties of the members of the N data storage devices. In this example, the reliability score may be based on the rate of failure and the age of a DSD in the N data storage devices. Repair logic 277 selectively repairs a member of the N data storage devices that is operating below a threshold reliability score. The decision to selectively repair a member of the N data storage devices may be based on the reliability score. The reliability score, or the properties upon which the reliability score is based, may be adjustable by a user.

In one embodiment of apparatus 200, the set of logics 270 includes erasure coding logic 279. Erasure coding logic 279 encodes a data object and stores the data object with parity on a member of the K columns of data storage devices. Erasure coding logic 279 may also decode an encoded data object stored with parity on the member of the K columns of data storage devices.

In one embodiment, erasure coding logic 279 selects a coding approach. Erasure coding logic 279 may select the coding approach based, at least in part, on an execution speed of the apparatus 200, a data protection overhead of the apparatus 200, a coding overheard of the erasure coding approach, a data rebuild characteristic of the data object, a data protection policy associated with the apparatus, a data protection policy associated with the data object, a data protection policy associated with a user, a reliability of a member of the N data storage devices, or a frequency of latent sector errors on a member of the N data storage devices. In one embodiment, the coding approach is a Reed-Solomon (RS) coding approach, a rateless coding approach, a Raptor coding approach, or a generic rateless coding approach that could be linear or non-linear. In another embodiment, other coding approaches may be used.

In one embodiment, erasure coding logic 279 adaptively stores erasure codes and codewords on the encoded HDD set using a systematic erasure code approach. The systematic erasure code approach may be based, at least in part, on optimizing local rebuilds within the apparatus 200. Optimizing local rebuilds includes minimizing bus input/output (IO) traffic in the apparatus 200. In one embodiment, data and parity data are physically separated or logically separated within the encoded HDD set by at least a threshold physical distance or a threshold logical distance. For example, data and parity data may be stored to an encoded HDD set defined on the column of DSDs including DSD AA 111, DSD BA 121, and DSD MA 131. Data may be stored to DSD AA 111, while parity data may be stored to DSD MA 131. In another example, data and parity data may be stored to other, different data storage devices.

In one embodiment, health check logic 275 produces the reliability score as a function of a probability that a member of the N data storage devices will fail. Health check logic 275 may also produce the reliability score based on the probability that a failed member of the N data storage devices or a latent sector error on a member of the N data storage devices can be repaired within a threshold amount of time or by using a threshold amount of resources. In this embodiment, repair logic 277 repairs the failed member of the N data storage devices or latent sector error on a member of the N data storage devices, based, at least in part, on the reliability score or the data protection policy. In another embodiment, repair logic 277 may be user controllable, or may repair the member of the N data storage devices or latent sector error on a member of the N data storage devices based on other properties of apparatus 200. In one embodiment, if a system does not have the ability to self reapir, then repair logic 277 may be configured to consider the amount of time it may take for human intervention in response to a notification that a DSD(s) needs repair.

In one embodiment, buffer logic 273 classifies data as a first classification, a second classification, or a third classification. Buffer logic 273 may classify data stored in the buffer 260. The classification may be based on a random stochastic probability function of a data access history of the data object and a status of data accessed from the data object. Data classified in the first classification is more likely to be accessed within a threshold period of time than data classified in the second classification. Data classified in the second classification is more likely to be accessed within the threshold period of time than data classified in the third classification. In one embodiment, the threshold period of time is one hour. In other embodiments, other periods of time may be used. In one embodiment, first classification data is defined as hot data, second classification data is defined as warm data, and third classification data is defined as cold data. In another embodiment, the number of classifications may be greater than three. Using more than three classifications may allow a more fine grained management of data. The number of classifications, and the definitions of the classifications may be user adjustable.

In one embodiment, buffer logic 273 regulates the level of data stored in the buffer 260. Buffer logic 273 may control buffer 260 to continue storing first classification data in the buffer 260. Buffer logic 273 may control the erasure coding logic 279 to encode and write second classification data to a member of the N data storage devices controlled to remain in low power idle mode after the second classification data is written. Buffer logic 273 may control erasure coding logic 273 to encode and write third classification data to a member of the N data storage devices controlled to remain in sleep mode after the third classification data is written. Thus, data that is more likely to be accessed within a threshold period of time is written to a data storage device that is kept in an active power mode, while data that is less likely to be accessed within the threshold period of time is written to a drive that is kept in a low power or sleep mode. Example methods and apparatus thus improve on conventional approaches by reducing the amount of power needed to store data by storing data that is less likely to be accessed on drives operating in lower power modes, while keeping frequently accessed data in the buffer 260, thereby reducing the number of spin-ups required of members of the N data storage devices.

Buffer logic 273 dynamically adaptively regulates the level of data stored in the buffer 260 based, at least in part, on the level of data stored in the buffer 260 and on the classification of the data stored in the buffer 260. For example, buffer logic 273 may maintain a data level in the buffer 260 above a lower threshold and below an upper threshold. If, for example, the level of data in the buffer 260 is approaching the upper threshold, and most of the data in the buffer 260 is first classification or hot data, buffer logic 273 may reclassify some of the first classification data currently in the buffer 260 as second classification or warm data, and clear space in the buffer 260 for other, incoming data by writing the newly classified second classification data to a member of the N data storage devices. In one embodiment, the buffer logic 273 may perform the reclassification based on cahce slot replacement policies including, but not limited to, least recently used (LRU) and least frequently used (LFU). In one embodiment, the buffer 260 is an SSD buffer, a cache, or a RAM buffer. In other embodiments, the buffer 260 may be a different type of buffer.

In one embodiment, data storage apparatus 200 uses a fanless cooling system. Apparatus 200 may also use no fans for cooling the N data storage devices. Example apparatus, by employing column-centric LEMs to control data storage devices independently of other data storage devices in a row, reduce power consumption compared to conventional devices to the extent that in some embodiments, no fans are needed to cool the apparatus 200 or a member of the N data storage devices.

In one embodiment, the functionality associated with the set of logics 270 may be performed, at least in part, by hardware logic components. The hardware logic components may include, but are not limited to, field-programmable gate arrays (FPGAs), application specific integrated circuits (ASICs), application specific standard products (ASSPs), system on a chip systems (SOCs), graphic processing units (GPUs), or complex programmable logic devices (CPLDs). In one embodiment, individual members of the set of logics 270 are implemented as ASICs or SOCs. In another embodiment, set of logics 270 may be other types of systems or circuits. Apparatus 200 may be operably connected to a smartphone, a laptop computer, a tablet computer, a desktop computer, a network communication device, or a set of data storage devices.

While FIG. 2 illustrates example apparatus 200 that includes various components connected in various ways, it is to be appreciated that other apparatus may include other components connected in other ways.

Figure 3:
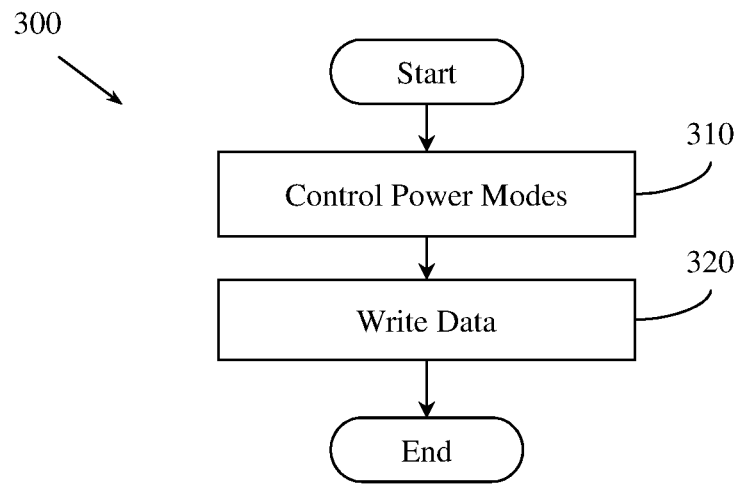
FIG. 3 illustrates an example method for controlling joint HDD and LEM power modes.

FIG. 3 illustrates an example method 300 for controlling joint HDD and LEM power modes. Method 300 includes, at 310, controlling the power mode of an LEM and a drive in an encoded HDD set. In one embodiment, the encoded HDD set is a column of HDDs in an array of HDDs. A row in the array of HDDs includes a set of HDDs and a row-centric power supply that supplies power to the row. A column in the array of HDDs includes a set of HDDs. In this embodiment, a column-centric LEM controls an HDD in the column, where the column is orthogonal to the row. In one example, a first LEM controlling a first encoded HDD set that is writing data may be controlled to operate in a first, full-power mode, and an HDD in the first encoded HDD set may be controlled to operate in a read/write mode with full power consumption. A second LEM associated with a second, different encoded HDD set that is on call but that is not writing data may be controlled to operate in a second, lower power mode, and an HDD in the second encoded HDD set may be controlled to operate in a lower power, active idle mode.

Method 300 also includes, at 320, sequentially writing a data set to the encoded HDD set. In one embodiment, an HDD that is reading or an HDD that is writing in the encoded HDD set is controlled by the LEM to operate in a first, higher power mode. An HDD that is not reading or an HDD that is not writing is controlled by the LEM to operate in a second, lower power mode. For example, a first HDD that is writing may be controlled to operate in a first, higher power mode. A second HDD that is reading may be controlled to operate in the first, higher power mode, while a third HDD that is neither reading nor writing may be controlled to operate in a second, lower power mode. In one embodiment, a prediction logic may selectively power up or down a HDD before an actual read/write operation is requested. The prediction logic may decide to selectively power up or down based, at least in part, on the temporal or spatial locality properties of the data. While incorrectly powering up or spinning up an HDD may negate some of the power savings of the systems described herein, a tradeoff between power savings and read/write performance may be made. Since spinning up or down takes a finite known amount of time, waiting to spin up or down until an actual need exists may reduce read/write performance. The prediction logic may, with a desired probability, find target DSDs operating at an appropriate power level for receiving read/write operations.

While FIG. 3 illustrates various actions occurring in serial, it is to be appreciated that some actions illustrated in FIG. 3 could occur substantially in parallel while other actions may proceed serially. By way of illustration, a first process could control the power mode of an LEM in an encoded HDD set, a second process could control the power mode of a disk drive in the encoded HDD set, and a third process could sequentially write a data set to the encoded HDD set. While three processes are described, it is to be appreciated that a greater or lesser number of processes could be employed and that lightweight processes, regular processes, threads, and other approaches could be employed. In one embodiment, the amount of processing that may need to be performed serially may be reduced by the prediction logic.

Figure 4:
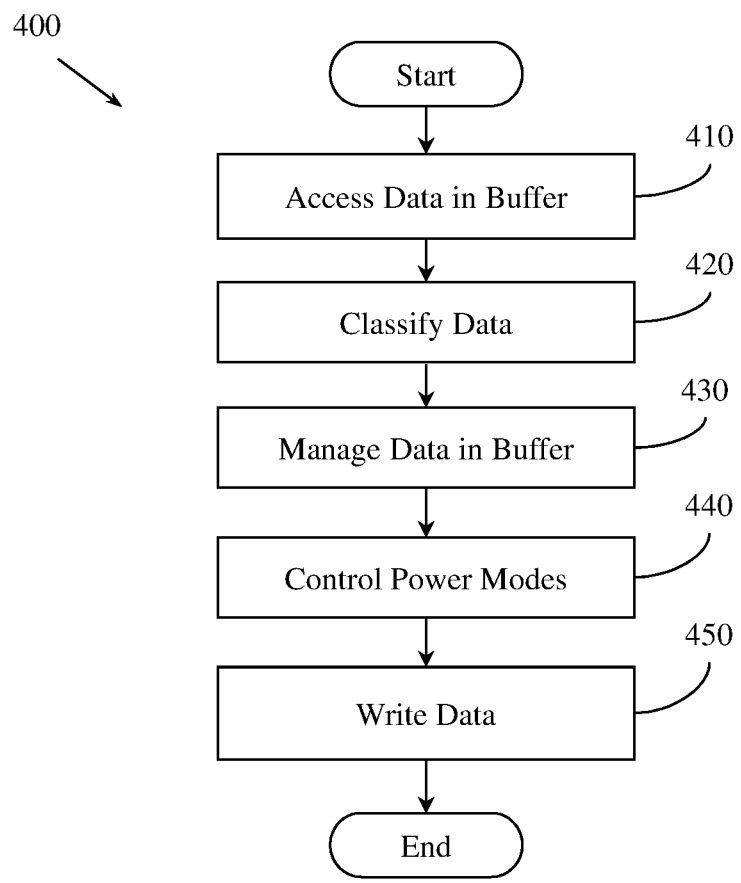
FIG. 4 illustrates an example method for controlling joint HDD and LEM power modes.

FIG. 4 illustrates a method 400 for controlling joint HDD and LEM power modes that is similar to method 300 but that contain additional steps. Method 400 includes, at 410, accessing a data set in a cache buffer. The cache buffer may be an SSD buffer, a RAM buffer, a cache, or other type of buffer.

Method 400 also includes, at 420, assigning a classification to the data set. Method 400 may classify the data set as a first classification, a second classification, or a third classification. The classification may be based, at least in part, on the probability that the data set will be accessed within a threshold period of time. The threshold period of time may be one second, one hour, one day, or a different period of time. In one embodiment, the classification is based on a random stochastic probability function of a data access history of the data set and a status of accessed data in the data set. In this embodiment, a data set classified in the first classification is more likely to be accessed within the threshold period of time than a data set classified in the second classification. A data set classified in the second classification is more likely to be accessed within the threshold period of time than a data set classified in the third classification. In another embodiment, the classification may be based on a different function.

Method 400 also includes, at 430, managing the amount of data in the cache buffer based, at least in part, on the available storage space in the cache buffer and on the classification of the data set. In one embodiment, managing the amount of data in the cache buffer includes keeping data classified in the first classification in the cache buffer, storing data classified in the second classification in a member of an encoded HDD set operating in a low power idle mode, and storing data classified in the third classification in a member of an encoded HDD set operating in a sleep mode. In another embodiment, more than three classifications may be used, and other, different power modes may be used. Managing the amount of data in the cache buffer may include considering the data's classification as a function of time. Thus, in one embodiment, managing the amount of data in the cache buffer may include processing eviction rules.

Method 400 may also include, at 430, dynamically adapting the amount of available storage space in the cache buffer. Dynamically adapting the amount of available storage space in the cache buffer may include maintaining the amount of data in the cache buffer above a lower threshold level, and maintaining the amount of data in the cache buffer below an upper threshold level. The lower threshold level and the upper threshold level may be user adaptable. In one embodiment, the lower threshold level is greater than zero.

Method 400 also includes, at 440, controlling the power mode of an LEM and the power mode of a drive in an encoded HDD set. The power mode of a member of an encoded HDD set may be controlled based, at least in part, on the classification of data stored on the member of the encoded HDD set. The power mode of an entire encoded HDD set and an associated LEM may be controlled based, at least in part, on the classification of data stored in the encoded HDD set, or on the position of the encoded HDD set in a data storage plan. For example, a data storage plan may schedule a first encoded HDD set to write a first data set, and a second, different encoded HDD set to change power mode from sleep to active idle while the first encoded HDD set is writing. The first encoded HDD set and a first LEM associated with the first encoded HDD set may be controlled to operate at first, higher power read/write mode, while the second encoded HDD set and a second, different LEM associated with the second encoded HDD set are brought up from sleep mode to active idle mode. The data storage plan may also schedule the second encoded HDD set to read a second data set at a time after the first encoded HDD set has finished writing. At a threshold time before the second encoded HDD set is scheduled to read, the second encoded HDD set may be controlled to switch power mode from active idle to read/write mode. By scheduling data storage devices to operate in different modes at different times, example methods and apparatus improve on conventional data cold storage approaches by reducing the power required to operate a data cold storage apparatus or to perform a data storage method.

Method 400 further includes, at 450, writing the data set to the encoded HDD set. In one embodiment, the data set is sequentially written to the encoded HDD set.

Figure 5:
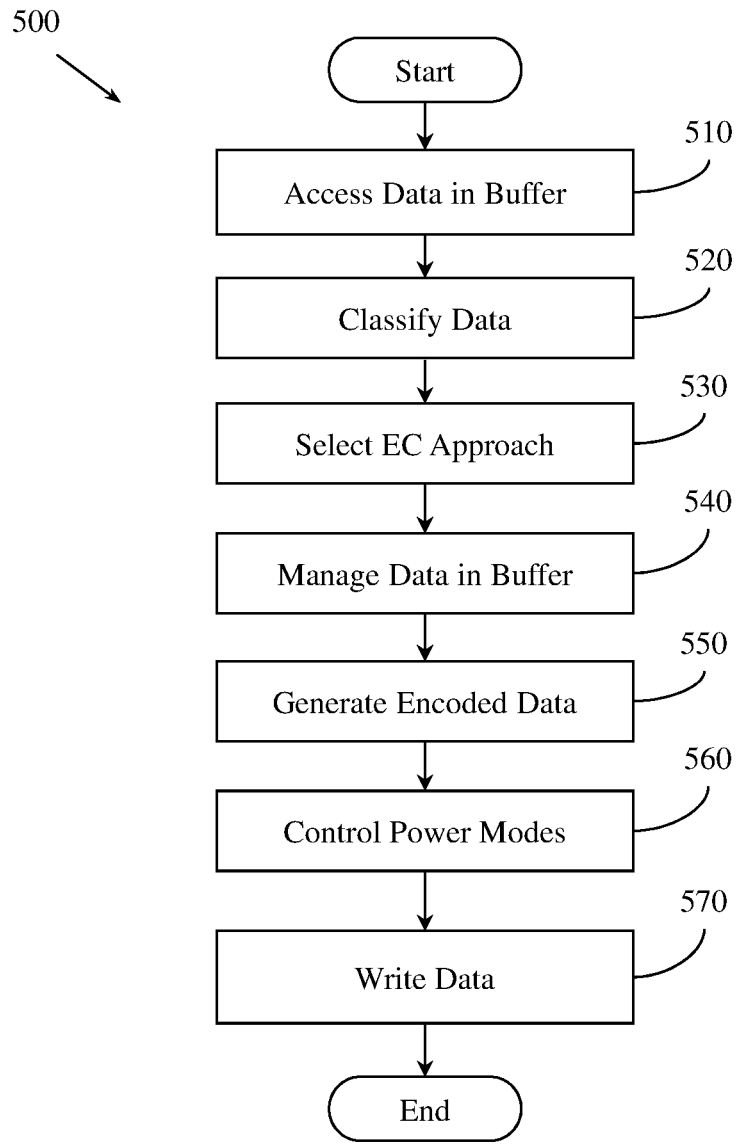
FIG. 5 illustrates an example method for controlling joint HDD and LEM power modes.

FIG. 5 illustrates an example method 500 that is similar to method 300 and method 400 but that includes additional steps. Method 500 includes, at 510, accessing a data set in a cache buffer. Method 500 also includes, at 520, assigning a classification to the data set. In one embodiment, method 500 may classify the data set as a first classification, a second classification, or a third classification. In another embodiment, other numbers of classifications may be employed.

Method 500 also includes, at 530, selecting an erasure coding approach. The erasure coding approach may be selected based, at least in part, on an execution speed of the array of HDDs or the speed of an HDD in the array of HDDs, a data protection overhead of the array of HDDs, a coding overheard of the erasure coding approach, a data rebuild characteristic of the data set, a data protection policy associated with the array, the data set, or a user, a data storage plan of a user, or a frequency of latent sector errors in a member of the array of HDDs. In another embodiment, the erasure coding approach may be selected based on other properties of the array of HDDs or on other, user selectable, parameters. The erasure coding approach may be a rateless coding approach (e.g., Raptor coding), or a Reed-Solomon approach. In another embodiment, other erasure coding approaches may be used.

Method 500 also includes, at 540, managing data in the cache buffer similarly to how managing data in the cache buffer is describe in method 400.

Method 500 also includes, at 550, generating an encoded data set by encoding the data set using the erasure coding approach.

Method 500 further includes, at 560, controlling the power mode of an LEM and a drive in an encoded HDD set.

Method 500 also includes, at 570, storing the encoded data set in the encoded HDD set. In one embodiment, storing the encoded data set in the encoded HDD set includes sequentially writing the encoded data set to the encoded HDD set. In one embodiment, encoded data and parity data are stored in HDDs in the encoded HDD set physically separated by at least a threshold physical distance, or logically separated by at least a threshold logical distance. In this embodiment, parity data is stored on an HDD in the encoded HDD set at the lowest available power mode. For example, encoded data may be stored on a first SMR drive in the encoded HDD set controlled to operate at a first higher power mode after the encoded data is written, while parity data may be stored on a second, different SMR drive in the encoded HDD set controlled to operate at a lower power mode after the parity data is written.

In one embodiment, method 500 may also include reading the stored data set or the stored encoded data set from the encoded HDD set.

Figure 6:
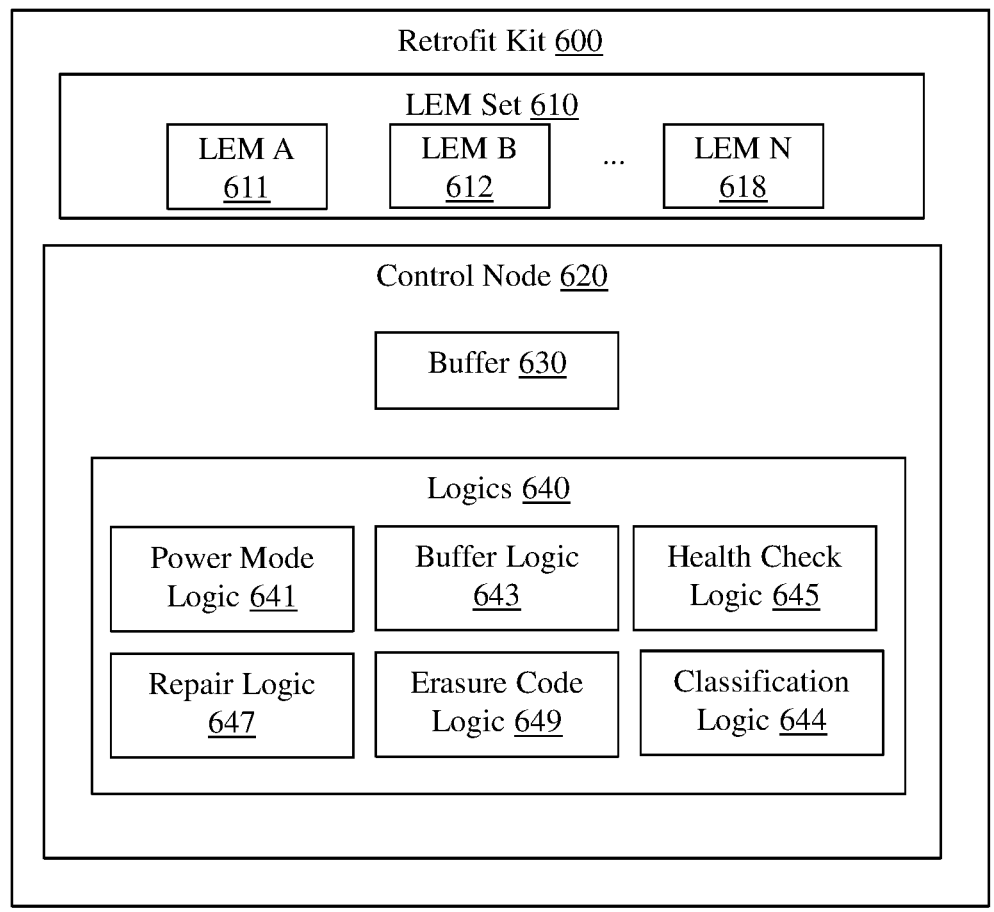
FIG. 6 illustrates an example data cold storage retrofit kit.

FIG. 6 illustrates an example data cold storage retrofit kit 600. Retrofit kit 600 interacts with an M by N array of data storage devices arrayed in a rack-mounted device, where the array has M rows and N columns, M and N being integers. Retrofit kit 600 includes a set 610 of at least N column-centric LEMs configured to be arranged orthogonally to the M rows of the array. In the implementation illustrated by FIG. 6, LEM set 610 includes a plurality of LEMs, represented as LEM A 611, LEM B 612, through LEM N 618. Thus, if N=30, LEM set 610 would contain at least 30 LEMs. An LEM controls a data storage device in a column of the array independently of other data storage devices in the same row or the same column as the data storage device. In one embodiment, an LEM has at least M ports. An LEM controls a data storage device in the column associated with the LEM through a member of the at least M ports. For example, if the array of data storage devices had 16 rows, an LEM would have at least 16 ports.

Retrofit kit 600 also includes a control node 620. Control node 620 includes an SSD buffer 630 and a set of logics 640. The set of logics 640 includes a power mode logic 641 that controls a power mode of a member of the array of data storage devices independently of other data storage devices in the same row or the same column, and that controls a power mode of a member of the at least N LEMs.

The set of logics 640 also includes a classification logic 644 that classifies a data object stored in the buffer 630 based on a model of the historic time series of the data access patterns. The data access patterns may be modeled as a random process using data fitting arguments and parameter estimations. The classification logic 644 may also classify a data object based, at least in part, on a status of data accessed from the data object. In one embodiment, classification logic 644 classifies the data object as having a first classification, a second classification, or a third classification. Data classified as being in the first classification is more likely to be accessed within a threshold period of time than data classified as being in the second classification. Data classified as being in the second classification is more likely to be accessed within the threshold period of time than data classified as being in the third classification. In another embodiment, classification logic 644 may classify the data object based on another function, or a different number of classifications may be used.

The set of logics 640 also includes a buffer logic 643 that adaptively regulates the level of data stored in the buffer 630. Buffer logic 643 determines whether a data object is to be stored in the buffer 630 or whether the data object is to be stored on a member of the array of data storage devices based, at least in part, on the classification of the data object.

The set of logics 640 also includes an erasure coding logic 649. Erasure coding logic 649 selects a coding approach based, at least in part, on an execution speed of the array of data storage devices, a data protection overhead of the array of data storage devices, a coding overheard of the coding approach, a data rebuild characteristic of the data object, a data protection policy of a user, a reliability of a member of the array of data storage devices, or a frequency of latent sector errors on a member of the array of data storage devices. The coding approach may be a Reed-Solomon (RS) coding approach, or a rateless coding approach. In another embodiment, other coding approaches may be used. Erasure coding logic 649 also generates an encoded data object by encoding the data object using the coding approach.

Erasure coding logic 649 also controls an LEM in the set of at least N LEMs to sequentially store the encoded data object on a member of the array of data storage devices controlled by the LEM. Erasure coding logic 649 may also read encoded data from a data storage device in the array.

In one embodiment, the set of logics 640 also includes a health check logic 645 and a repair logic 647. Health check logic 645 produces a reliability score as a function of a probability that a member of the array of data storage devices will fail within a threshold period of time. Health check logic 645 may also produce the reliability score as a function of a probability that a failed member of the array of data storage devices or a latent sector error on a member of the array of data storage devices can be repaired within a threshold amount of time or by using a threshold amount of resources. In this embodiment, repair logic 647 repairs the failed member of the array of data storage devices or the latent sector error on a member of the array of data storage devices, based, at least in part, on the reliability score or a data protection policy. The data protection policy may be associated with the array of data storage devices, with the retrofit kit 600, with the data object, or with a user of the retrofit kit 600. In another embodiment, the reliability score may be based on other properties of the array of data storage devices or of the retrofit kit 600.

Figure 7:
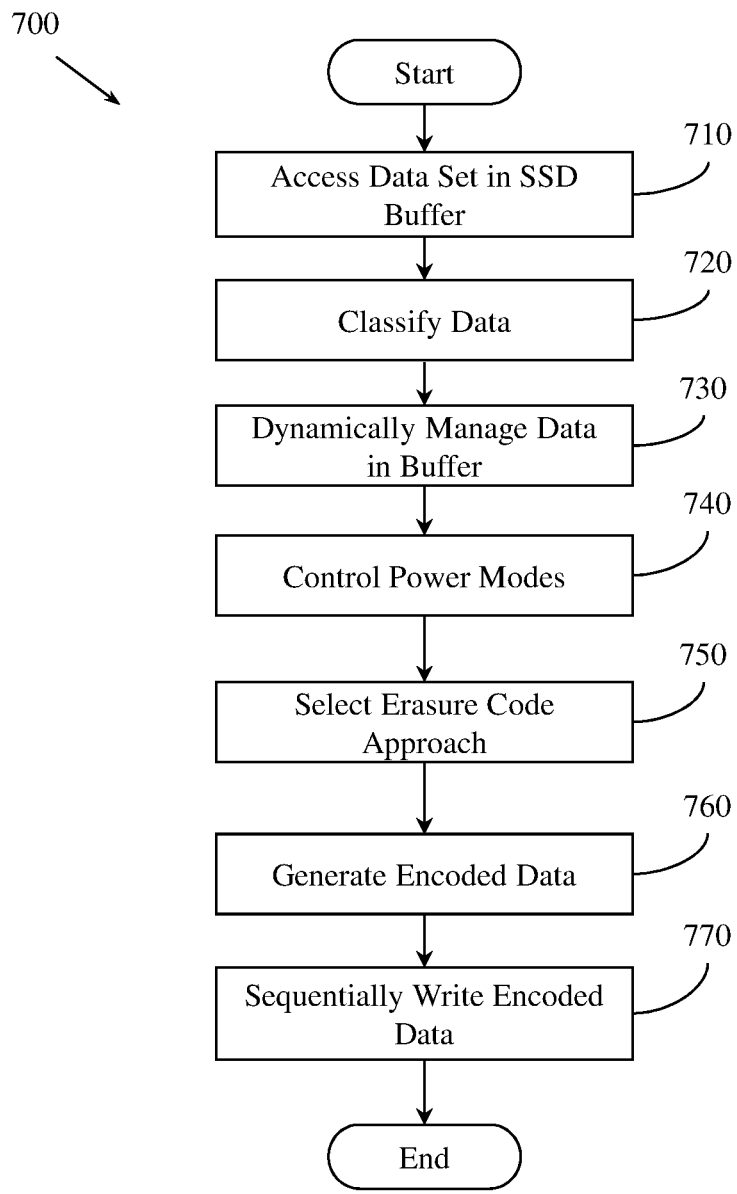
FIG. 7 illustrates an example method for storing data in a power efficient manner.

FIG. 7 illustrates an example method 700 for storing data in a power efficient manner. Method 700 includes, at 710 accessing a data set in an SSD buffer. Accessing the data set in the SSD buffer may include, for example, reading data from the SSD buffer.

Method 700 also includes, at 720, assigning a classification to the data set by classifying the data set as being in a first classification, a second classification, or a third classification. The classification is based, at least in part, on a random stochastic probability function of a data access history of the data set and a status of accessed data in the data set. In one embodiment, data classified in the first classification is more likely to be accessed within a threshold period of time than data classified in the second classification, and data classified in the second classification is more likely to be accessed within the threshold period of time than data classified in the third classification. In another embodiment, the classification may be based on a different function of different variables. Different numbers of classifications may be employed.

Method 700 also includes, at 730 dynamically managing the amount of data in the SSD buffer based, at least in part, on the available storage space in the SSD buffer and on the classification of the data set. In one embodiment, managing the amount of data in the SSD buffer includes keeping data classified in the first classification in the SSD buffer, storing data classified in the second classification in a member of the encoded HDD set operating in a low power idle mode, and storing data classified in the third classification in a member of an encoded HDD set operating in a sleep mode. In another embodiment, other power modes may be employed. In this example, the encoded HDD set is a column of SMR drives in an array of HDDs. In another embodiment, other types of data storage devices may be employed, including HDDs, tape drives, SSDs, and other types of storage devices.

Method 700 also includes, at 740, controlling the power mode of a LEM and an SMR drive in the encoded HDD set. A row in the array of HDDs includes a set of HDDs and a row-centric power supply that supplies power to the row. A column in the array includes a set of HDDs and a column-centric LEM that controls an HDD in the column, where the column is orthogonal to the row. The column-centric LEM controls an HDD in the column independently of other HDDs in the same row as the controlled HDD in the column.

Method 700 also includes, at 750, selecting an erasure coding approach. Method 700 may select the erasure coding approach based, at least in part, on an execution speed of the array of HDDs, a data protection overhead of the array of HDDs, a coding overheard of the erasure coding approach, a data rebuild characteristic of the data set, a data protection policy associated with the data set, the array, or a user, a data storage plan of a user, or a frequency of latent sector errors in a member of the array of HDDs. In one embodiment, the erasure coding approach is a rateless approach or an RS approach. In another embodiment, other erasure coding approaches may be employed.

Method 700 also includes, at 760, generating an encoded data set by encoding the data set using the erasure coding approach. The encoded data set includes encoded data and parity data.

Method 700 also includes, at 770, sequentially writing the encoded data set to the encoded HDD set. The encoded data set may be separated into chunks and distributed over the encoded HDD set. Method 700 may sequentially write the encoded data set to the encoded HDD set according to a data storage plan. The data storage plan may be based, at least in part, on the classification. In one embodiment, a reading HDD in the encoded HDD set is controlled to operate in a first, higher power mode by the LEM. A writing HDD in the encoded HDD set is controlled to operate in the first, higher power mode. A non-reading HDD or a non-writing HDD is controlled to operate in a second, lower power mode by the LEM. In this embodiment, parity data is stored on an HDD in the encoded HDD set at the lowest available power mode.

Figure 8:
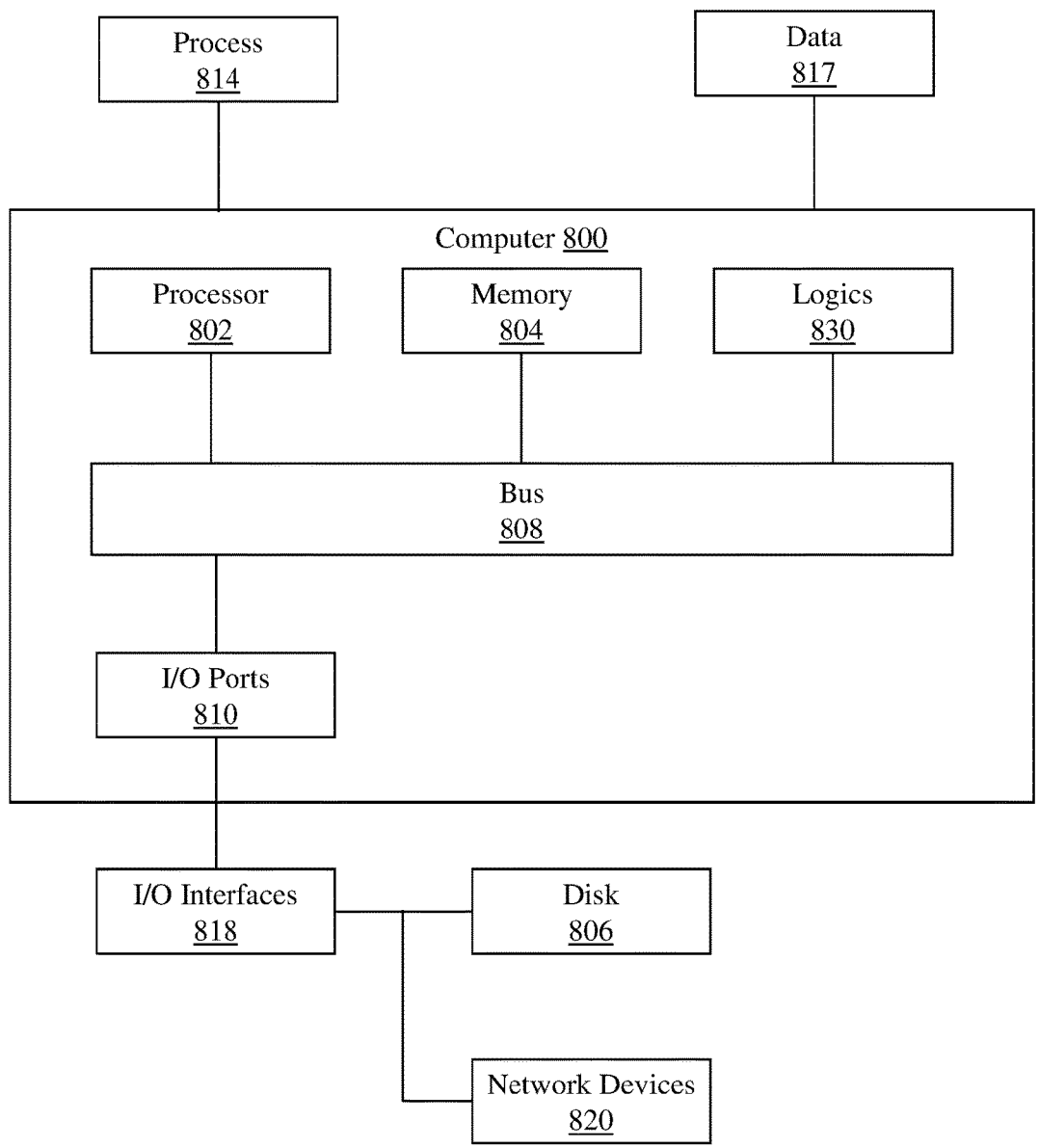
FIG. 8 illustrates an example computer in which methods and apparatus described herein may be implemented.

FIG. 8 illustrates an example computer 800 in which example methods illustrated herein can operate and in which example logics may be implemented. In different examples, computer 800 may be part of a router, a server, a laptop computer, a tablet computer, or may be operably connectable to a data storage device.

Computer 800 includes a processor 802, a memory 804, and input/output ports 810 operably connected by a bus 808. In one example, computer 800 may include a set of logics 830 that perform a method of controlling joint HDD and LEM power modes. Thus, the set of logics 830, whether implemented in computer 800 as hardware, firmware, software, and/or a combination thereof may provide means (e.g., hardware, software) for controlling joint HDD and LEM power modes. In different examples, the set of logics 830 may be permanently and/or removably attached to computer 800. In one embodiment, the functionality associated with the set of logics 830 may be performed, at least in part, by hardware logic components including, but not limited to, FPGAs, ASICs, ASSPs, SOCs, or CPLDs. In one embodiment, individual members of the set of logics 830 are implemented as ASICs or SOCs.

Processor 802 can be a variety of various processors including dual microprocessor and other multi-processor architectures. Memory 804 can include volatile memory and/or non-volatile memory. A disk 806 may be operably connected to computer 800 via, for example, an input/output interface (e.g., card, device) 818 and an input/output port 810. Disk 806 may include, but is not limited to, devices like a magnetic disk drive, a tape drive, a Zip drive, a flash memory card, or a memory stick. Furthermore, disk 806 may include optical drives like a CD-ROM or a digital video ROM drive (DVD ROM). Memory 804 can store processes 814 or data 817, for example. Disk 806 or memory 804 can store an operating system that controls and allocates resources of computer 800.

Bus 808 can be a single internal bus interconnect architecture or other bus or mesh architectures. While a single bus is illustrated, it is to be appreciated that computer 800 may communicate with various devices, logics, and peripherals using other busses that are not illustrated (e.g., PCIE, SATA, Infiniband, 1394, USB, Ethernet).

Computer 800 may interact with input/output devices via I/O interfaces 818 and input/output ports 810. Input/output devices can include, but are not limited to, a keyboard, a microphone, a pointing and selection device, cameras, video cards, displays, disk 806, network devices 820, or other devices. Input/output ports 810 can include but are not limited to, serial ports, parallel ports, or USB ports.

Computer 800 may operate in a network environment and thus may be connected to network devices 820 via I/O interfaces 818 or I/O ports 810. Through the network devices 820, computer 800 may interact with a network. Through the network, computer 800 may be logically connected to remote computers. The networks with which computer 800 may interact include, but are not limited to, a local area network (LAN), a wide area network (WAN), or other networks.

References to "one embodiment", "an embodiment", "one example", and "an example" indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage medium", as used herein, refers to a non-transitory medium that stores instructions or data. "Computer-readable storage medium" does not refer to propagated signals. A computer-readable storage medium may take forms, including, but not limited to, non-volatile media, and volatile media. Non-volatile media may include, for example, optical disks, magnetic disks, tapes, and other media. Volatile media may include, for example, semiconductor memories, dynamic memory, and other media. Common forms of a computer-readable storage medium may include, but are not limited to, a floppy disk, a flexible disk, a hard disk, a magnetic tape, other magnetic medium, an application specific integrated circuit (ASIC), a compact disk (CD), other optical medium, a random access memory (RAM), a read only memory (ROM), a memory chip or card, a memory stick, and other media from which a computer, a processor or other electronic device can read.

"Logic", as used herein, includes but is not limited to hardware or firmware, or combinations of each to perform a function(s) or an action(s), or to cause a function or action from another logic, method, or system. Logic may include a software controlled microprocessor, a discrete logic (e.g., ASIC), an analog circuit, a digital circuit, a programmed logic device, a memory device containing instructions, and other physical devices. Logic may include one or more gates, combinations of gates, or other circuit components.

Where multiple logical logics are described, it may be possible to incorporate the multiple logical logics into one physical logic. Similarly, where a single logical logic is described, it may be possible to distribute that single logical logic between multiple physical logics.

To the extent that the term "includes" or "including" is employed in the detailed description or the claims, it is intended to be inclusive in a manner similar to the term "comprising" as that term is interpreted when employed as a transitional word in a claim.

Throughout this specification and the claims that follow, unless the context requires otherwise, the words 'comprise' and 'include' and variations such as 'comprising' and 'including' will be understood to be terms of inclusion and not exclusion. For example, when such terms are used to refer to a stated integer or group of integers, such terms do not imply the exclusion of any other integer or group of integers.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

While example systems, methods, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and other embodiments described herein. Therefore, the invention is not limited to the specific details, the representative apparatus, and illustrative examples shown and described. Thus, this application is intended to embrace alterations, modifications, and variations that fall within the scope of the appended claims.

What is claimed is:

1. An apparatus, comprising:
   N data storage devices arranged in K columns and M rows, where the K columns are orthogonal to the M rows, K, M, and N being integers,
   where a row of data storage devices has an associated row-centric power supply that supplies power to the row of data storage devices,
   where a column of data storage devices has an associated column-centric local electronics module (LEM) that controls a data storage device in the column of data storage devices independently of other data storage devices in the same row as the data storage device,
   where a column of data storage devices in the apparatus includes an encoded hard disk drive (HDD) set,
   where an LEM has at least M ports,
   where an LEM controls a data storage device in a column associated with the LEM through one of the M ports,
   where the data storage apparatus includes at least K LEMs and M row-centric power supplies;
   a control node comprising:
      a buffer; and
      a set of circuits comprising:
         a power mode circuit configured to control a power mode of a member of the N data storage devices independently of other data storage devices in the same row as the member of the N data storage devices, and that controls a power mode of a member of the K LEMs;
         an erasure coding circuit configured to:
            encode a data object,
            store the data object with parity on a member of the K columns of data storage devices, or decode an encoded data object stored with parity on the member of the K columns of data storage devices, and
            adaptively store erasure codes and codewords on the encoded HDD set based, at least in part, on optimizing local rebuilds; and
         a buffer circuit configured to:
            adaptively regulate the level of data stored in the buffer, and
            determine whether a data object will be stored in the buffer or whether the data object will be stored on a member of the N data storage devices based, at least in part, on the level of data stored in the buffer or a classification of the data object.

2. The apparatus of claim 1, where the erasure coding circuit is further configured to adaptively store erasure codes and codewords on the encoded HDD set using a systematic erasure code approach.

3. The apparatus of claim 2, where optimizing local rebuilds includes minimizing bus input/output (IO) traffic in the apparatus.

4. The apparatus of claim 2, where data and parity data are physically separated or logically separated within the encoded HDD set by at least a threshold physical distance or a threshold logical distance.

5. The data storage apparatus of claim 1, where the erasure coding circuit is configured to select a coding approach based, at least in part, on an execution speed of the apparatus, a data protection overhead of the apparatus, a coding overheard of the coding approach, a data rebuild characteristic of the data object, a data protection policy associated with the apparatus, the data object, or a user, a reliability of a member of the N data storage devices, or a frequency of latent sector errors on a member of the N data storage devices.

6. The data storage apparatus of claim 5, where the coding approach is a Reed-Solomon (RS) coding approach or a rateless coding approach.

7. The data storage apparatus of claim 1, the set of circuits further comprising:
   a health check circuit configured to produce a reliability score fora member of the N data storage devices; and
   a repair circuit configured to selectively repair a member of the N data storage devices that is operating below a threshold reliability score based, at least in part, on the reliability score.

8. A non-transitory computer-readable storage device storing computer executable instructions that when executed by a computer control the computer to perform a method, the method comprising:
   controlling a power mode of a local electronic module (LEM) and a drive in an encoded hard disk drive (HDD) set,
   where the encoded HDD set is a column of HDDs in an array of HDDs,
   where a row in the array of HDDs includes a set of HDDs and a row-centric power supply that supplies power to the row, and a column in the array of HDDs includes a set of HDDs, and
   where a column-centric LEM controls an HDD in the column, where the column is orthogonal to the row;

sequentially writing a data set to the encoded HDD set, where an HDD that is reading or an HDD that is writing in the encoded HDD set is controlled by the LEM to operate in a first, higher power mode, and where an HDD that is not reading or an HDD that is not writing is controlled by the LEM to operate in a second, lower power mode;

accessing a data set in a cache buffer;

assigning a classification to the data set by classifying the data set as having a first classification, a second classification, or a third classification, based, at least in part, on a probability that the data set will be accessed within a threshold period of time, where a data set classified in the first classification is more likely to be accessed within the threshold period of time than a data set classified in the second classification, and where a data set classified in the second classification is more likely to be accessed within the threshold period of time than a data set classified in the third classification; and managing the amount of data in the cache buffer based, at least in part, on the available storage space in the cache buffer and on the classification of the data set, where managing the amount of data in the cache buffer includes keeping data classified in the first classification in the cache buffer, storing data classified in the second classification in a member of an encoded HDD set operating in a low power idle mode, and storing data classified in the third classification in a member of an encoded HDD set operating in a sleep mode.

9. The non-transitory computer-readable storage device of claim 8, where the classification is based on a probability function of a data access history of the data set and a status of accessed data in the data set.

10. The non-transitory computer-readable storage device of claim 9, where the probability function is a random stochastic probability function.

11. The non-transitory computer-readable storage device of claim 8, the method further comprising dynamically adapting the amount of available storage space in the cache buffer, where dynamically adapting the amount of available storage space in the cache buffer includes maintaining the amount of data in the cache buffer above a lower threshold level, and maintaining the amount of data in the cache buffer below an upper threshold level.

12. The non-transitory computer-readable storage device of claim 8, the method further comprising:

selecting an erasure coding approach based, at least in part, on an execution speed of the array of HDDs, a data protection overhead of the array of HDDs, a coding overheard of the erasure coding approach, a data rebuild characteristic of the data set, a data storage plan of a user, a frequency of latent sector errors in a member of the array of HDDs, or a data protection policy associated with the array, the data set, or the user;

generating an encoded data set by encoding the data set using the erasure coding approach; and storing the encoded data set in the encoded HDD set.

13. The non-transitory computer-readable storage device of claim 12, where the erasure encoding approach is a generic rateless approach or a Reed-Solomon (RS) approach.

14. The non-transitory computer-readable storage device of claim 12, where storing the encoded data set in the encoded HDD set includes sequentially writing the encoded data set to the encoded HDD set.

15. The non-transitory computer readable storage device of claim 12, where storing the encoded data set includes storing the encoded data and parity data in HDDs in the encoded HDD set to be physically separated by at least a threshold physical distance, or to be logically separated by at least a threshold logical distance, and storing the parity data on an HDD in the encoded HDD set operating at the lowest available power mode.

16. The non-transitory computer readable storage device of claim 12, the method further comprising reading the stored data set or the stored encoded data set from the encoded HDD set.

17. A non-transitory computer-readable storage device that stores instructions that when executed by a processor control the processor to perform operations, the operations including:

accessing a data set in a solid state device (SSD) buffer;

assigning a classification to the data set by classifying the data set as having a first classification, a second classification, or a third classification, based, at least in part, on a probability of a data access history of the data set and a status of accessed data in the data set, where data classified in the first classification is more likely to be accessed within a threshold period of time than data classified in the second classification, and where data classified in the second classification is more likely to be accessed within the threshold period of time than data classified in the third classification;

dynamically managing the amount of data in the SSD buffer based, at least in part, on the available storage space in the SSD buffer and on the classification of the data set, where managing the amount of data in the SSD buffer includes keeping data classified in the first classification in the SSD buffer, storing data classified in the third classification in a member of an encoded HDD set operating in a sleep mode, and storing data classified in the second classification in a member of the encoded HDD set operating in a low power idle mode, where the encoded HDD set is a column of HDDs in an array of HDDs;

controlling the power mode of a local electronics module (LEM) and an HDD in the encoded HDD set, where a row in the array includes a set of HDDs and a row-centric power supply that supplies power to the row, and a column in the array includes a set of HDDs and a column-centric LEM that controls an HDD in the column, where the column is orthogonal to the row;

selecting an erasure coding approach based, at least in part, on an execution speed of the array of HDDs, a data protection overhead of the array of HDDs, a coding overheard of the erasure coding approach, data rebuild characteristics of the data set, a data protection policy associated with the data set, the array, or a user, a data storage plan of a user, or a frequency of latent sector errors in a member of the array of HDDs;

generating an encoded data set by encoding the data set using the erasure coding approach, where the encoded data set includes encoded data and parity data; and sequentially writing the encoded data set to the encoded HDD set according to a data storage plan based, at least in part, on the classification, where a reading HDD in the encoded HDD set is controlled to operate in a first, higher power mode by the LEM, where a writing HDD in the encoded HDD set is controlled to operate in the first, higher power mode, and where a non-reading HDD or a non-writing HDD is controlled to operate in a second, lower power mode by the LEM, and where parity data is stored on an HDD in the encoded HDD set at the lowest available power mode.

18. The non-transitory computer-readable storage device of claim 17, the operations further including computing the probability of the data access history of the data set using a random stochastic probability function.

19. The non-transitory computer-readable storage device of claim 17, where the encoded HDD set is a column of shingled magnetic recording (SMR) drives in an array of HDDs.

20. The non-transitory computer-readable storage device of claim 17, where the erasure coding approach is a generic rateless approach or a Reed-Solomon (RS) approach.

\* \* \* \* \*